United States Patent
Yan et al.

(10) Patent No.: US 11,547,025 B2
(45) Date of Patent: Jan. 3, 2023

(54) FREQUENCY CONVERTER CABINET BODY AND FREQUENCY CONVERTER

(71) Applicant: Siemens Aktiengesellschaft, Munich (DE)

(72) Inventors: Dong Liang Yan, Wuxi (CN); Qing Long Zhong, Shanghai (CN); Wan Bao Zhang, Shanghai (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/272,981

(22) PCT Filed: Sep. 4, 2018

(86) PCT No.: PCT/CN2018/103968
§ 371 (c)(1),
(2) Date: Mar. 3, 2021

(87) PCT Pub. No.: WO2020/047741
PCT Pub. Date: Mar. 12, 2020

(65) Prior Publication Data
US 2021/0219458 A1 Jul. 15, 2021

(51) Int. Cl.
*H01F 27/00* (2006.01)
*H05K 7/20* (2006.01)
(Continued)

(52) U.S. Cl.
CPC ..... *H05K 7/20909* (2013.01); *H01F 27/2876* (2013.01); *H02M 7/003* (2013.01); *H05K 7/20145* (2013.01); *H05K 7/20172* (2013.01)

(58) Field of Classification Search
CPC .......... Y02B 70/10; H02K 11/33; H02K 1/32; H02K 5/20; H02K 17/12; H02K 9/16;
(Continued)

(56) References Cited

U.S. PATENT DOCUMENTS

2017/0117687 A1* 4/2017 Smith ................. H02B 1/56
2018/0352685 A1* 12/2018 Wan ................... H05K 7/20909

FOREIGN PATENT DOCUMENTS

CN      202840910 U      3/2013
CN      106169875 A      11/2016
(Continued)

OTHER PUBLICATIONS

International Search Report and Written Opinion dated May 17, 2019.

*Primary Examiner* — Mandeep S Buttar
(74) *Attorney, Agent, or Firm* — Harness, Dickey & Pierce, P.L.C.

(57) ABSTRACT

A frequency changer cabinet includes a transformer cabinet to accommodate a transformer, a first air outlet being disposed at a top of the transformer cabinet, and a first air inlet being disposed at a side wall; and a power unit cabinet to accommodate at least one power unit, a second air inlet being disposed at a front side wall, and a rear side of the being connected to the transformer cabinet. In an embodiment, a first air passage baffle and a second air passage baffle are respectively disposed at an upper end and a lower end of a secondary coil, such that air entering from the power unit cabinet to the transformer cabinet can be directly sent to the secondary coil. Further, air entering from the first air inlet can pass through a primary coil and the secondary coil, and then flow out of the transformer cabinet.

20 Claims, 5 Drawing Sheets

(51) Int. Cl.
*H01F 27/28* (2006.01)
*H02M 7/00* (2006.01)

(58) Field of Classification Search
CPC .. H02K 9/00; H02K 5/04; H02P 27/04; H02P 27/047; F04B 2203/0204; H05K 5/0213; H05K 7/20909; H05K 7/1432; H05K 5/0217; H05K 7/20145; H05K 5/0247; H05K 7/20172; H01F 27/2876; H02M 7/003
USPC ............. 361/695, 676, 679.02; 318/503, 807
See application file for complete search history.

(56) References Cited

FOREIGN PATENT DOCUMENTS

| | | | |
|---|---|---|---|
| CN | 106169875 | B | 9/2018 |
| JP | 2016163392 | A | 9/2016 |
| JP | 2016220416 | A | 12/2016 |
| JP | 6296303 | B2 | 3/2018 |

\* cited by examiner

US 11,547,025 B2

FREQUENCY CONVERTER CABINET BODY AND FREQUENCY CONVERTER

PRIORITY STATEMENT

This application is the national phase under 35 U.S.C. § 371 of PCT International Application No. PCT/CN2018/103968 which has an International filing date of Sep. 4, 2018, which designated the United States of America, the entire contents of which are hereby incorporated herein by reference.

FIELD

Embodiments of the invention generally relate to the technical field of electrical engineering, in particular to a frequency converter cabinet body and a frequency converter having the frequency converter cabinet body.

BACKGROUND

A frequency converter, that is to say, an electric energy control device utilizing the make and break function of a power semiconductor device to convert an industrial-frequency power supply to another power supply whose frequency is different, is widely applied for the control of AC motors. As the operating voltage and the power of a frequency converter increase, the volume of the transformer and the number of power units in the frequency converter will increase accordingly. To avoid too large a volume from influencing the deployment of a frequency converter, a higher-power-density frequency converter needs to be designed, that is to say, the specific volume power in a frequency converter cabinet body needs to be increased.

Increasing the power density of a frequency converter can reduce the volume of the frequency converter, but will also reduce the space of the cooling air duct in the frequency converter cabinet body. To make up for the reduced cooling effect caused by a small space occupied by the cooling air duct, currently a higher-performance fan is usually used for heat dissipation of the frequency converter. However, the higher the performance of the fan is, the larger the size is. The size of the fan is also restricted by the size of the frequency converter cabinet body. When the frequency converter cabinet body cannot hold the fan, the cabinet body must be increased to satisfy the heat dissipation requirement.

SUMMARY

Embodiments of the present invention provide a frequency converter cabinet body and a frequency converter to lower the performance requirements of the fan for the frequency converter.

In a first embodiment, the present invention provides a frequency converter cabinet body, comprising:

a transformer cabinet, configured to accommodate a transformer, a first air outlet being provided on the top of the transformer cabinet, and a first air inlet being provided in the side wall of the transformer cabinet, and a power unit cabinet, configured to accommodate at least one power unit, a second air inlet being provided in the front side wall of the power unit cabinet, and the rear side of the power unit cabinet communicating with the transformer cabinet;

a first air duct baffle and a second air duct baffle are provided in the transformer cabinet, and the first air duct baffle and the second air duct baffle are respectively disposed at the upper end and the lower end of a secondary coil of the transformer so that air entering the transformer cabinet from the power unit cabinet can directly blow onto the secondary coil;

under the action of the fan provided at the first air outlet, air from the first air inlet may pass through a primary coil and a secondary coil of the transformer and then flow out of the transformer cabinet via the first air outlet, and air from the second air inlet may pass through the at least one power unit and the secondary coil in turn and then flow out of the transformer cabinet via the first air outlet.

In a second embodiment, the present invention further provides a frequency converter, comprising:

a transformer, at least one power unit, at least one fan and any frequency converter cabinet body provided in the first aspect, wherein the at least one fan is provided at the first air outlet, the at least one fan is configured to draw air from the transformer, the transformer is provided in the transformer cabinet, and the at least one power unit is provided in the power unit cabinet.

BRIEF DESCRIPTION OF THE DRAWINGS

The following detailed description in combination with the drawings will make more obvious other characteristics, features and advantages of the present invention.

DETAILED DESCRIPTION OF THE INVENTION

Figure 1:
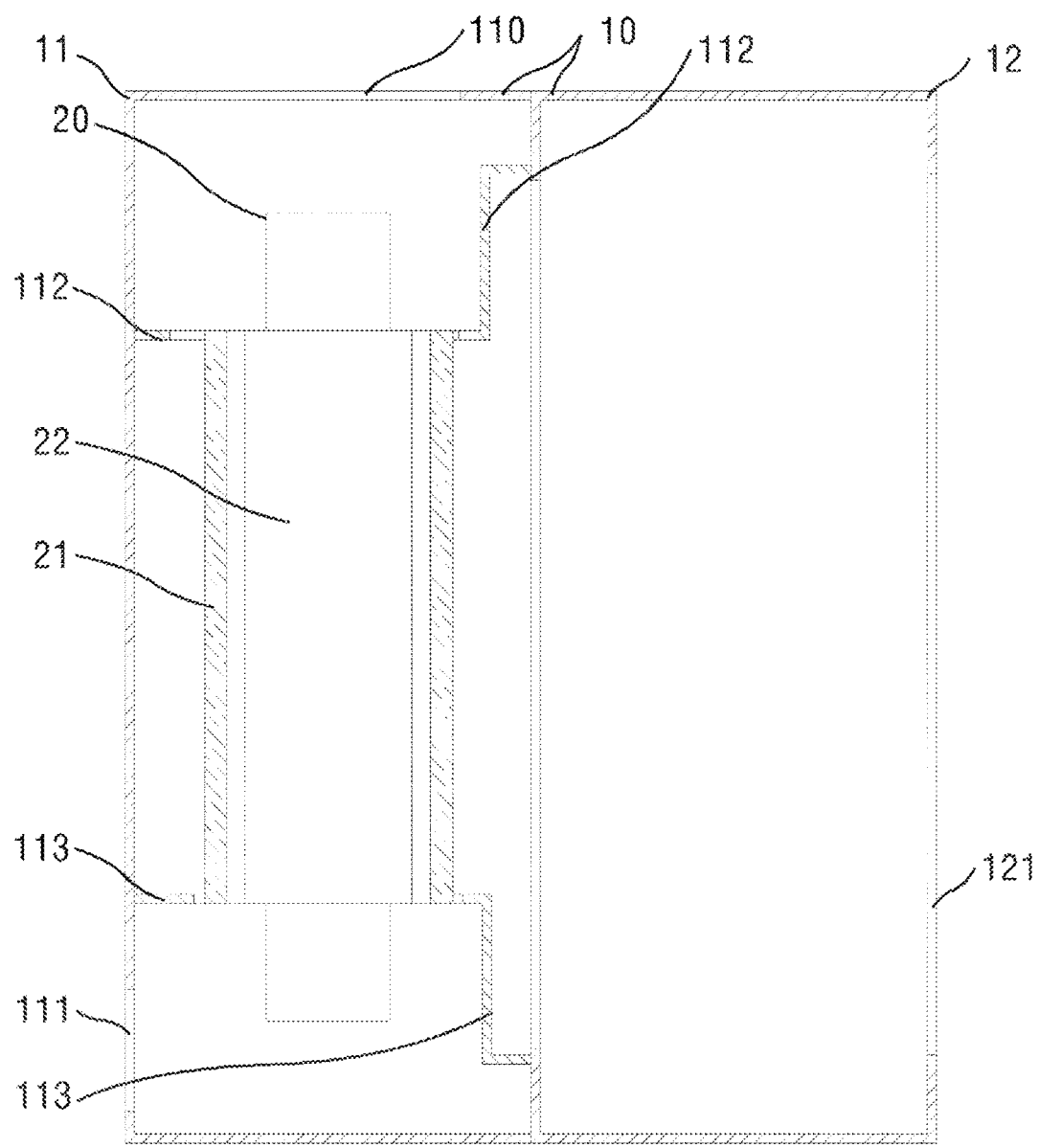
FIG. 1 is side cutaway view of the frequency converter cabinet in one embodiment of the present invention.

In a first embodiment, the present invention provides a frequency converter cabinet body, comprising:

a transformer cabinet, configured to accommodate a transformer, a first air outlet being provided on the top of the transformer cabinet, and a first air inlet being provided in the side wall of the transformer cabinet, and a power unit cabinet, configured to accommodate at least one power unit, a second air inlet being provided in the front side wall of the power unit cabinet, and the rear side of the power unit cabinet communicating with the transformer cabinet;

a first air duct baffle and a second air duct baffle are provided in the transformer cabinet, and the first air duct baffle and the second air duct baffle are respectively disposed at the upper end and the lower end of a secondary coil of the transformer so that air entering the transformer cabinet from the power unit cabinet can directly blow onto the secondary coil;

under the action of the fan provided at the first air outlet, air from the first air inlet may pass through a primary coil and a secondary coil of the transformer and then flow out of the transformer cabinet via the first air outlet, and air from the second air inlet may pass through the at least one power unit and the secondary coil in turn and then flow out of the transformer cabinet via the first air outlet.

In one illustrative embodiment of the frequency cabinet body, the front side of the transformer cabinet communicates with the rear side of the power unit cabinet and the first air inlet is provided at the bottom of the rear side wall of the transformer cabinet.

With the first air inlet provided at the bottom of the rear side wall of the transformer cabinet, on the one hand, the flowing direction of cooling air can be guaranteed to comply with the flow law of gas and the static pressure in the transformer cabinet can be reduced. On the other hand, cooling air is forced to enter the frequency converter cabinet body from the front and rear sides of the frequency converter cabinet body, respectively, avoiding turbulent flows which cause an air pressure loss from being formed in the frequency converter cabinet body.

In one illustrative embodiment of the frequency converter cabinet body, second air outlets, whose number is equal to the number of phases of the transformer, are provided on the first air duct baffle in a direction parallel to the rear side wall of the power unit cabinet, one coil winding of the transformer passes through each of the second air outlets, and the clearance between the side, close to the power unit cabinet, of each of the second air outlets and the coil winding is less than the clearance between the side away from the power unit cabinet and the coil winding.

The asymmetric design is adopted for the second air outlets on the first air duct baffle, and the clearance between the side, close to the power unit cabinet, of the second air outlets and the second coil is less than the clearance between the side away from the power unit cabinet and the secondary coil so that the static pressure on the side where the secondary coil is close to the power unit cabinet is greater than the static pressure on the other side where the secondary coil is away from the power unit cabinet. Then, more of the cooling air entering the transformer cabinet from the power unit cabinet can pass through the secondary coil of the transformer, ensuring that the secondary coil of the transformer can fully be cooled.

In one illustrative embodiment of the frequency converter cabinet body, a third air inlet which can be opened or closed is provided in the area located between each of the second air outlets and the power unit cabinet on the first air duct baffle, when the third air outlet is in a closed state, air from the second air inlet passes through the first air duct baffle via each of the second air outlets and then flows out of the transformer cabinet via the first air outlet, and when the third air outlet is in an open state, air from the second air inlet passes through the first air duct baffle via each of the second air outlets and the third air outlet and then flows out of the transformer cabinet via the first air outlet.

With the third air outlet provided on the first air duct baffle, the third air outlet can be opened or closed according to the pressure loss after air passes through the secondary coil and the power unit to ensure that the static pressures in the frequency converter cabinet and the power unit cabinet are both small and each power unit can fully be cooled.

In one illustrative embodiment of the frequency converter cabinet body, the third air outlet comprises at least two open states having different ventilating apertures.

The third air outlet has a plurality of open states and different open states correspond to different ventilating apertures. The third air outlet can be adjusted to different open states according to the pressure loss after air passes through the power units and the secondary coil so that a relatively balanced static pressure is achieved in the space between the first air duct baffle and the second air duct baffle and in the power unit cabinet. Thus, the frequency converter cabinet body can be applied to frequency converters having different numbers of power units and different layout patterns and has high applicability.

In one illustrative embodiment of the frequency converter cabinet body, third air outlets, whose number is equal to the number of phases of the transformer, are provided on the second air duct baffle in a direction parallel to the rear side wall of the power unit cabinet, one coil winding passes through each of the third air inlets, and for each of the third air inlets, a clearance is provided between the third air inlet and the coil winding.

Since a clearance exists between the third air inlet and the coil winding, air from the first air inlet can pass through the clearance and then contact the secondary coil of the transformer to help air from the second air inlet to cool the secondary coil, and thus the cooling requirement for the secondary coil is guaranteed to be satisfied.

In one illustrative embodiment of the frequency converter cabinet body, the distance between the front side wall and the rear side wall of the power unit cabinet is greater than the length of one of the power units but less than the length of two of the power units.

The distance between the front side wall and the rear side wall of the power unit cabinet is designed to be greater than the length of one of the power units but less than the length of two of the power units so that only one layer of the power units can be arranged in the power unit cabinet in a direction perpendicular to the front side wall of the power unit cabinet. In this way, each flow of air entering the power unit cabinet from the second air inlet can enter the transformer cabinet after passing through a power unit in the flowing direction, and the pressure loss of air from the second air inlet in the power unit cabinet is small. With the cooling requirement for the power units satisfied, the cooling effect on the secondary coil is improved. In addition, the size of the power unit cabinet can be reduced to facilitate the layout of the frequency converter.

In a second embodiment, the present invention further provides a frequency converter, comprising:

a transformer, at least one power unit, at least one fan and any frequency converter cabinet body provided in the first aspect, wherein the at least one fan is provided at the first air outlet, the at least one fan is configured to draw air from the transformer, the transformer is provided in the transformer cabinet, and the at least one power unit is provided in the power unit cabinet.

In one illustrative embodiment of the frequency converter, the at least one power unit is provided in the power unit cabinet in the manner of a matrix, and only one layer of the power units is provided in a direction perpendicular to the front side wall of the power unit cabinet.

From the above-mentioned technical solutions, it can be seen that, in the frequency converter cabinet body and the frequency converter provided by the present invention, the first air duct baffle and the second air baffle are provided at the upper end and the lower end of the secondary coil of the transformer, respectively, air from the first air inlet passes through the primary coil and the secondary coil of the transformer and then flows out of the transformer cabinet via the first air outlet, and air from the second air inlet passes through the power units and the secondary coil of the transformer in turn and then flows out of the transformer cabinet via the first air outlet. Thus, it can be seen that the cooling air duct of the power units and the cooling air duct of the secondary coil of the transformer are connected in series, and the air ducts connected in series and the cooling air duct of the primary coil of the transformer are connected in parallel. The design of air ducts connected in series and in parallel can improve the utilization of cooling air and guarantee a low static pressure in the frequency converter cabinet body. Thus, the utilization of the fan is improved, the heat dissipation requirement for the frequency converter can be satisfied by using a lower-performance fan, and then the fan performance required for the frequency converter is reduced.

To make the objects, technical solutions, and advantages of the present invention clearer, the following text gives embodiments in order to further describe the present invention in detail.

As shown in FIG. 1, an embodiment of the present invention provides a frequency converter cabinet body 10 and the frequency converter cabinet body 10 may comprise:

a transformer cabinet 11 configured to accommodate a transformer 20, a first air outlet 110 being provided on the top of the transformer cabinet 11, and a first air inlet 111 being provided in the side wall of the transformer cabinet 11, and a power unit cabinet 12 configured to accommodate at least one power unit, a second air inlet 121 being provided in the front side wall of the power unit cabinet 12, and the rear side of the power unit cabinet 12 communicating with the transformer cabinet 11, a first air duct baffle 112 and a second air duct baffle 113 are provided in the transformer cabinet 11, and the first air duct baffle 112 and the second air duct baffle 113 are respectively disposed at the upper end and the lower end of a secondary coil 21 of the transformer 20 so that air entering the transformer cabinet 11 from the power unit cabinet 12 can directly blow onto the secondary coil 21, under the action of the fan provided at the first air outlet 110, air from the first air inlet 111 may pass through a primary coil 22 and the secondary coil 21 of the transformer 20 and then flow out of the transformer cabinet 11 via the first air outlet 110, and air from the second air inlet 121 may pass through the power units 30 and the secondary coil 21 in turn and then flow out of the transformer cabinet 11 via the first air outlet 110.

In the frequency converter cabinet body provided by an embodiment of the present invention, the first air duct baffle and the second air baffle are provided at the upper end and the lower end of the secondary coil of the transformer, respectively, air from the first air inlet passes through the primary coil of the transformer and then flows out of the transformer cabinet via the first air outlet, and air from the second air inlet passes through the power units and the secondary coil of the transformer in turn and then flows out of the transformer cabinet via the first air outlet. Thus, it can be seen that the cooling air duct of the power units and the cooling air duct of the secondary coil of the transformer are connected in series, and the air ducts connected in series and the cooling air duct of the primary coil of the transformer are connected in parallel. The design of air ducts connected in series and in parallel can improve the utilization of cooling air and guarantee a low static pressure in the frequency converter cabinet body. Thus, the utilization of the fan is improved, the heat dissipation requirement for the frequency converter can be satisfied by using a lower-performance fan, and then the fan performance required for the frequency converter is reduced.

Alternatively, on the basis of the frequency converter cabinet body 10 shown in FIG. 1, the front side of the transformer cabinet 11 communicates with the rear side of the power unit cabinet 12. In this case, the first air inlet 111 is provided at the bottom of the rear side wall of the transformer cabinet 11.

Firstly, the first air inlet is provided at the bottom of the side wall of the transformer cabinet and the first air outlet is provided at the top of the transformer cabinet. Air from the first air inlet passes through the primary coil and the secondary coil of the transformer to absorb heat, and then flows out of the first air outlet. In this way, the air temperature in the lower part of the transformer cabinet is lower than the air temperature in the upper part, the flow law of gas is complied with, and a small static pressure in the frequency converter cabinet body is guaranteed.

Secondly, the first air inlet is provided in the rear side wall of the transformer cabinet and the second air inlet is provided in the front side wall of the power unit cabinet. Cooling air enters the frequency converter cabinet body from the front side and the rear side of the frequency converter cabinet. On the one hand, turbulent flows which cause an air pressure loss can be avoided in the frequency converter cabinet body. On the other hand, only that fact that no obstacle blocks the air inlets on the front side and the rear side needs to be considered during the layout of the frequency converter and therefore it is more convenient to lay out the frequency converter.

Figure 2:
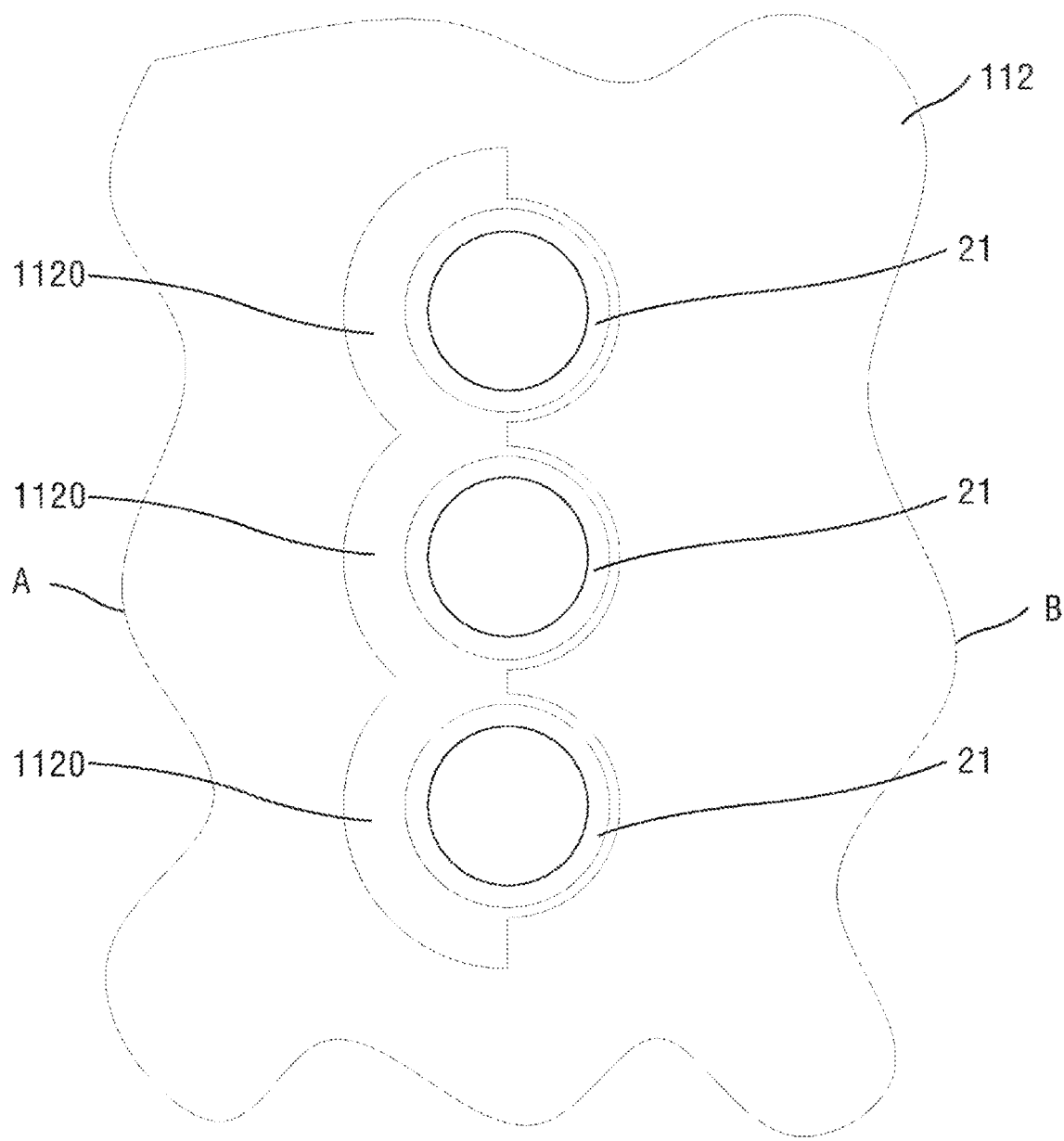
FIG. 2 is a top view of the first air duct baffle in one embodiment of the present invention.

Alternatively, on the basis of the frequency converter cabinet body 10 shown in FIG. 1, a plurality of second air outlets 1120 are provided on the first air duct baffle 112 in a direction parallel to the rear side wall of the power unit cabinet, wherein the number of the second air outlets 1120 corresponds to the number of the phases of the transformer, and a coil winding passes through each second air outlet 1120, as shown in FIG. 2. For each of the second air outlets 1120, the clearance between the side, close to the power unit cabinet, of the second air outlet 1120 and the coil winding is less than the clearance between the side, away from the power unit cabinet, of the second air outlet 1120 and the coil winding. The clearance between the second air outlet 1120 and the coil winding refers to the clearance between the second air outlet 1120 and the outer side wall of the secondary coil 21 of the coil winding. In addition, each winding coil comprises a primary coil 22 and a secondary coil 21, the primary coil is located inside the secondary coil and an insulating cylinder is provided between the primary coil 22 and the secondary coil 21.

To be specific, three second air outlets 1120, corresponding to a three-phase transformer, are provided on the first air duct baffle 112 shown in FIG. 2, side B of the first air duct baffle 112 is the side close to the power unit cabinet, and side A of the first air duct baffle 112 is the side away from the power unit cabinet.

The asymmetric design is adopted for the second air outlets on the first air duct baffle, and the clearance between the side, close to the power unit cabinet, of the second air outlets and the second coil is less than the clearance between the side away from the power unit cabinet and the secondary coil so that the static pressure on the side where the secondary coil is close to the power unit cabinet is greater than the static pressure on the other side where the secondary coil is away from the power unit cabinet. Then, more of the cooling air entering the transformer cabinet from the power unit cabinet can pass through the secondary coil of the transformer, ensuring that the secondary coil of the transformer can fully be cooled.

Figure 3:
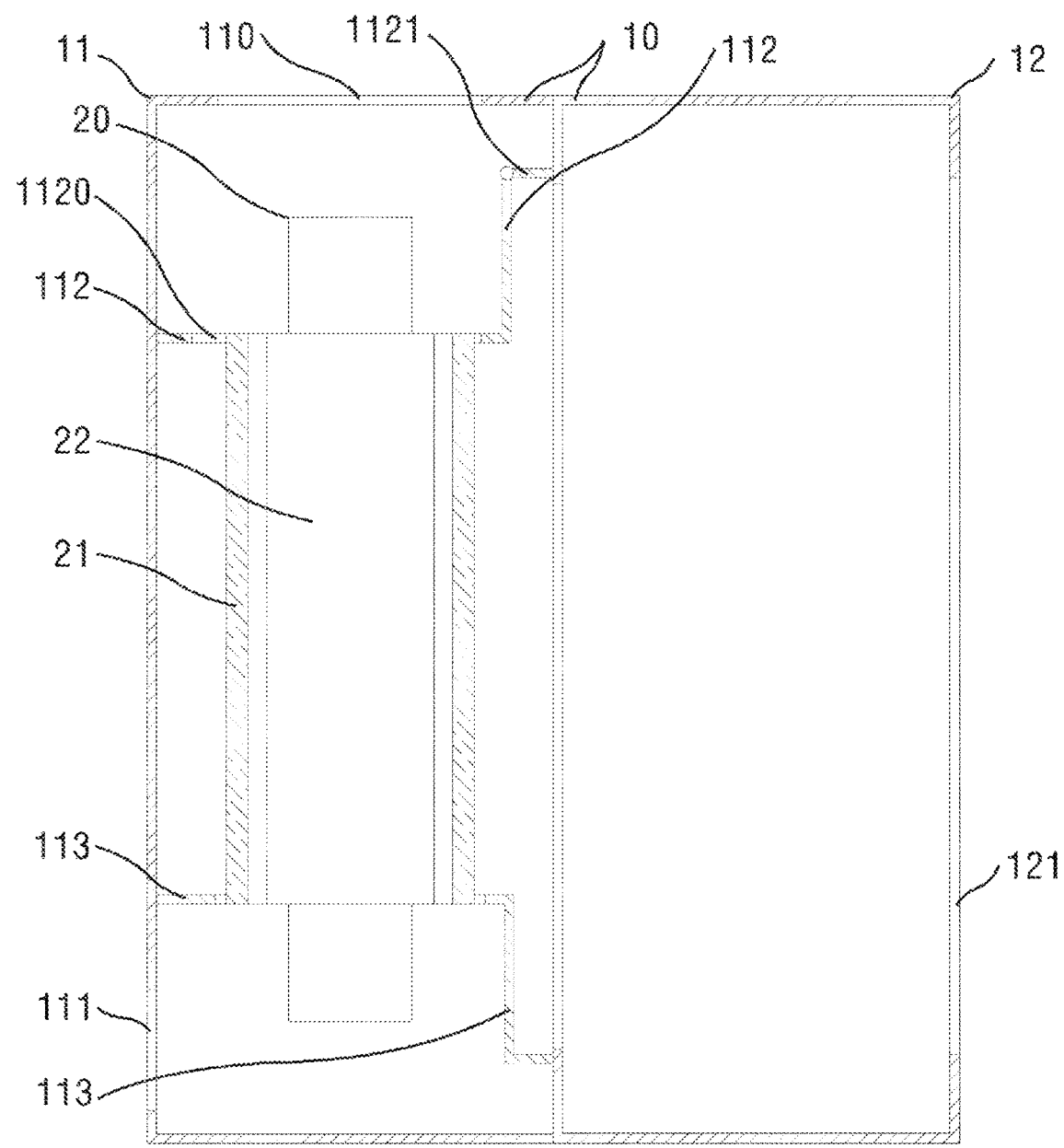
FIG. 3 is a side cutaway view of the frequency converter cabinet in another embodiment of the present invention.

Alternatively, on the basis of the first air duct baffle 112 shown in FIG. 2, a third air inlet 1121 which can be opened or closed is provided in the area located between each of the second air outlets 1120 and the power unit cabinet 12 on the first air duct baffle 112, as shown in FIG. 3. When the third air outlet 1121 is in a closed state, air from the second air inlet 121 passes through the first air duct baffle 112 via each of the second air outlets 1120 and then flows out of the transformer cabinet 11 via the first air outlet 110, and when the third air outlet 1121 is in an open state, air from the second air inlet 121 passes through the first air duct baffle 112 via each of the second air outlets 1120 and the third air outlet 1121 and then flows out of the transformer cabinet 11 via the first air outlet 110.

The third air outlet 1121 which can be opened and closed is provided on the first air duct baffle 112 located in the area between the primary coil 22 and the power unit cabinet 12. If the pressure loss after air from the second air inlet 121 passes through the power unit is small, the third air outlet 1121 can be put in a closed state. In this case, all of the air from the second air inlet 121 passes through the secondary coil 21 and then passes through the first air duct baffle 112 via the second air outlets 1120. The cooling effect on the secondary coil 21 is improved. If the pressure loss after air from the second air inlet 121 passes through the power unit is large, the third air outlet 1121 can put in an open state. In this case, a part of air from the second air inlet 121 passes through the first air duct baffle 112 via the third air outlet 1121, and the remainder of air from the second air inlet 121 passes through the secondary coil 21 and then passes through the first air duct baffle 112 via the second air outlets 1120 to ensure that the static pressures in the frequency converter cabinet 11 and the power unit cabinet 12 are both small and the cooling requirement for the transformer 20 and the power units is satisfied.

With the third air outlet provided on the first air duct baffle, the third air outlet can be opened or closed according to the pressure loss after air passes through the secondary coil and the power unit to ensure that the static pressures in the frequency converter cabinet and the power unit cabinet are both small and each power unit can fully be cooled.

Alternatively, on the basis of the frequency converter cabinet body 10 shown in FIG. 3, the third air outlet 1121 comprises at least two open states having different ventilating apertures. To be specific, the ventilating aperture of the third air outlet 1121 can be adjusted in a stepless adjustment mode. In this case, the ventilating aperture of the third air outlet 1121 can be adjusted to any value between zero and the maximum. In addition, the ventilating aperture of the third air outlet 1121 can be adjusted in a multi-level adjustment mode and different gears correspond to different ventilating apertures. In this case, the ventilating aperture of the third air outlet 1121 can be adjusted to the corresponding ventilating aperture at any level.

The third air outlet corresponds to a plurality of open states, and different open states correspond to different ventilating apertures. According to the pressure loss after cooling air passes through the power units and the secondary coil, the third air outlet can be adjusted to different open states to adjust the ventilation volume of each of the second air outlets and the third air outlet in such a way that a relatively balanced static pressure is achieved in the space between the first air duct baffle and the second air duct baffle and in the power unit cabinet. With the cooling effect on the power units guaranteed, air as much as possible passes through the secondary coil of the transformer, and the cooling effect on the secondary coil is improved. Therefore, the frequency converter cabinet body provided in the present embodiment can be applied to frequency converters having different number of power units and different layout patterns and has high applicability.

Figure 4:
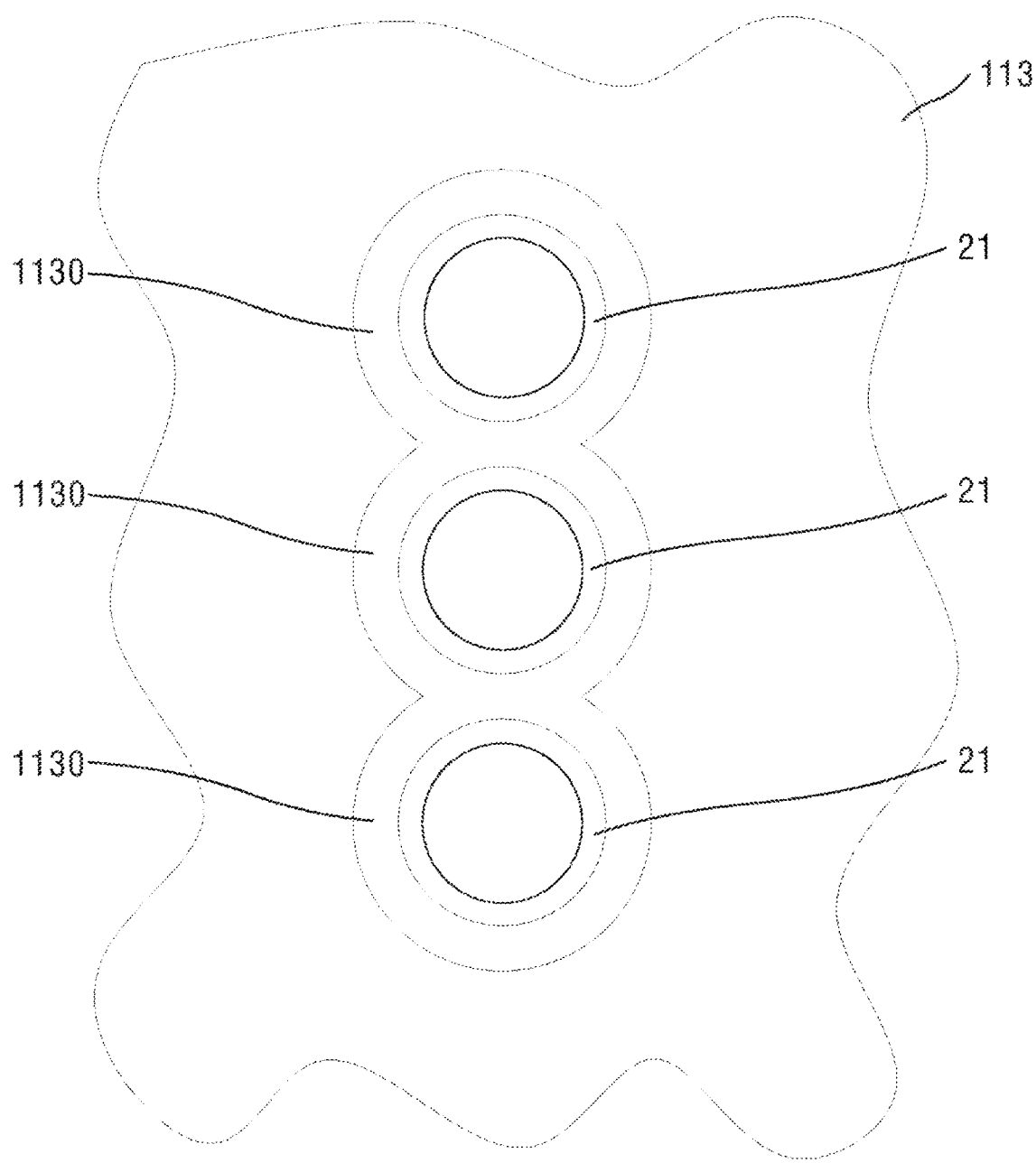
FIG. 4 is a top view of the second air duct baffle in one embodiment of the present invention.

Alternatively, on the basis of the frequency converter cabinet body 10 shown in FIG. 3, a plurality of third air inlets 1130 are provided on the second air duct baffle 113 in a direction parallel to the rear side wall of the power unit cabinet, wherein the number of the third air inlets 1130 corresponds to the number of the phases of the transformer, a coil winding passes through each third air inlet 1130, and a clearance is provided between each third air inlet 1130 and the coil winding, as shown in FIG. 4. The clearance between the third air inlet 1130 and the coil winding refers to the clearance between the third air inlet 1130 and the outer side wall of the secondary coil 21 of the coil winding.

When the third air outlet 1121 is in an open state, a part of air from the second air inlet 121 will not pass through the secondary coil 21, but directly pass through the first air duct baffle 112 via the third air outlet 1121. Since the volume of air passing through the secondary coil 21 is small, it may be unable to satisfy the cooling requirement for the secondary coil 21. In this case, after air from the first air inlet 111 passes through the third air inlets 1130, a part of air passes through the inside of the primary coil 22 and then flows out of the transformer cabinet 11 via the first air outlet 110, and the other part of air passes through the secondary coil 21 and then flows out the first air duct baffle 112 via the second air outlets 1120 and the third air outlet 1121. In this way, by utilizing a part of air from the second air inlet 121 and a part of air from the first air inlet 111 to cool the secondary coil 21, the cooling requirement for the secondary coil 21 is guaranteed to be satisfied.

With the third air inlets provided on the second air duct baffle, when the third air outlet is in an open state, four air ducts may be formed in the frequency converter cabinet body: the first air duct is a cooling air duct of the power units and the first cooling air duct enables air from the second air inlet to enter the transformer cabinet after passing through the power units; the second air duct is a cooling air duct of the secondary coil and the second air duct enables air entering the transformer cabinet from the power unit cabinet to pass through the first air duct baffle via the second air outlet and the third air outlets and then flow out of the transformer cabinet via the first air outlet; the third air duct is also a cooling air duct of the secondary coil and the third air duct enables a part of air from the first air inlet to pass through the second air duct baffle via the third air inlet, pass through the first air duct baffle via the second air outlet and the third air outlet after passing through the secondary coil, and then flow out of the transformer cabinet via the first air outlet; the fourth air duct is a cooling air duct of the primary coil and the fourth cooling air duct enables a part of air from the first air inlet to pass through the inside of the primary coil and finally flow out of the transformer cabinet via the first air outlet. Among the four air ducts, the first air duct and the second air duct are connected in series, the third air duct and the fourth air duct are connected in parallel, and the second air duct and the third air duct have an overlapped portion.

Alternatively, on the basis of the frequency converter cabinet body provided in any of the above-mentioned embodiments, the distance between the front side wall and the rear side wall of the power unit cabinet 12 is greater than the length of a power unit but less than the length of two power units.

Power units are arranged lengthwise in the power unit cabinet, that is to say, the lengthwise direction of the power units is perpendicular to the front side wall and the rear side wall of the power unit cabinet. To ensure that the pressure loss of air coming from the second air inlet and passing through the power units is small, the distance between the front side wall and the rear side wall of the power unit cabinet is kept less than the length of two power units. In this way, only one power unit can be arranged in a direction perpendicular to the front side wall and the rear side wall in the power unit cabinet, and power units may be arranged in the manner of a matrix in a direction parallel to the front side wall and the rear side wall of the power unit cabinet. Thus, each air flow entering the power unit cabinet from the second air inlet can enter the transformer cabinet after passing through a power unit in the flowing direction and the pressure loss of air from the second air inlet in the power unit cabinet is small. With the cooling requirement for the power units satisfied, the cooling effect on the secondary coil is improved. In addition, the size of the power unit cabinet can be reduced to facilitate the layout of the frequency converter.

It should be noted that, in the above-mentioned embodiments, the passing of air via a second air outlet refers to the passing of air via the clearance between the side wall of the second air outlet and the primary coil and secondary coil passing through the second air outlet, the passing of air via the third air inlet refers to the passing of air via the clearance between the side wall of the third air inlet and the primary coil and second coil passing through the third air inlet, the air from the first air inlet refers to air entering the transformer cabinet from the first air inlet, and air from the second air inlet refers to air entering the power unit cabinet from the second air inlet.

Figure 5:
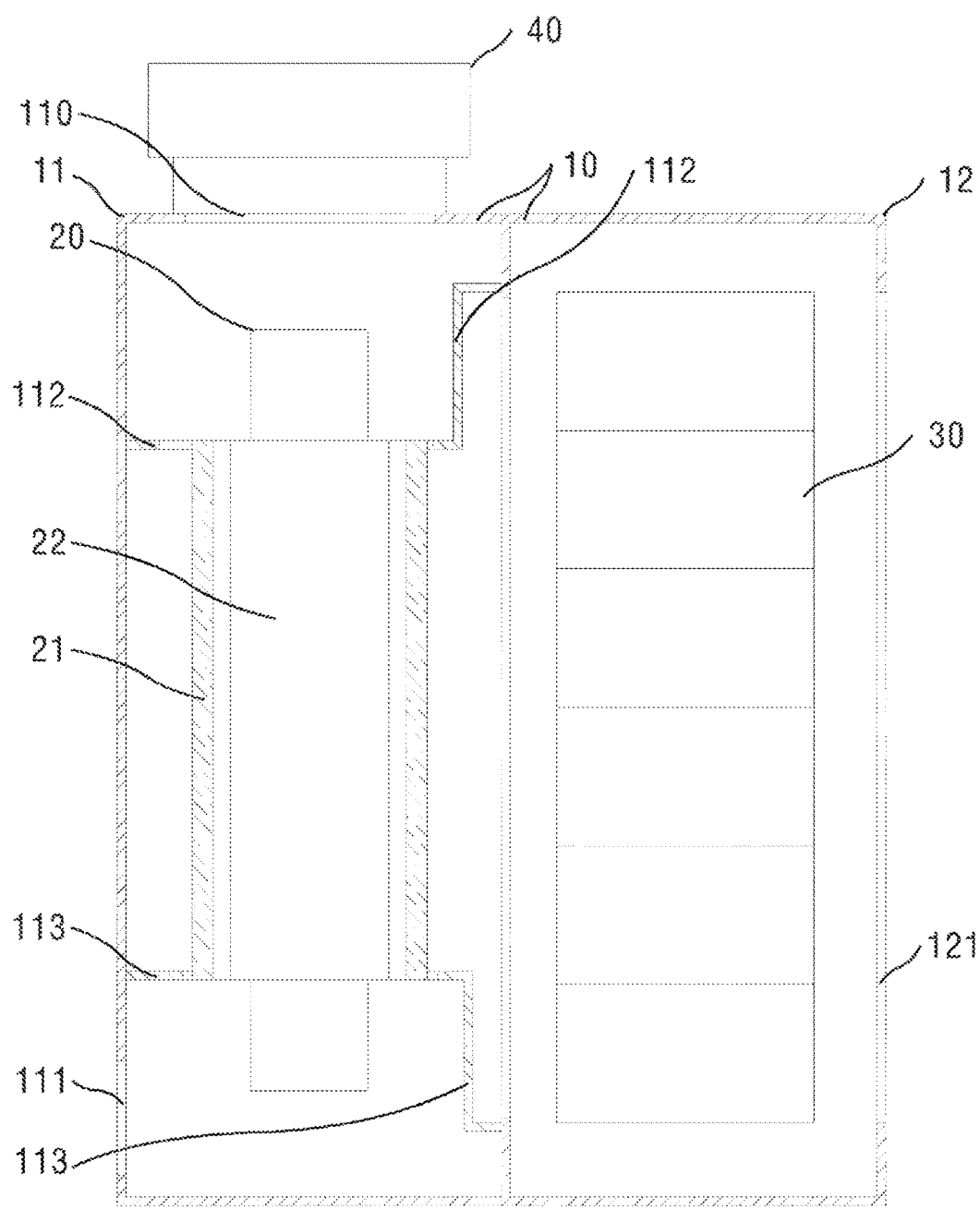
FIG. 5 is a side cutaway view of the frequency converter in one embodiment of the present invention.

As shown in FIG. 5, one embodiment of the present invention provides a frequency converter, which comprises: a transformer 20, at least one power unit 30, at least one fan 40 and the frequency converter cabinet body 10 provided in any of the above-mentioned embodiments;

wherein the fans 40 are provided at the first air outlet 110, the first air outlet 110 is provided at the top of the transformer cabinet 11 contained in the frequency converter cabinet body 10, and the fans 40 are used to draw air from the transformer 11, the transformer 20 is provided in the transformer cabinet 11, at least one power unit 30 is provided in the power unit cabinet 12.

Alternatively, on the basis of the frequency converter shown in FIG. 5, power units are provided in the manner of a matrix in the power unit cabinet 12 and only one layer of power units 30 is provided in a direction perpendicular to the front side wall of the power unit cabinet 12.

It should be noted that the sizes of the frequency converter cabinet body and the frequency converter provided in the embodiments of the present invention are not restricted, and the lengths, heights and widths of the frequency converter cabinet body and the frequency converter may flexibly be set according to the actual requirements.

It should also be noted that the frequency converter cabinet body provided in the embodiments of the present invention may be made of a transparent material so that the working statuses of components such as power units and transformer in the frequency converter cabinet body can be observed conveniently. Of course, the frequency converter cabinet body may be made of a non-transparent material, for example steel sheet.

In a word, the frequency converter cabinet body and frequency converter provided by the present invention at least have the following advantages:

1. In the frequency converter cabinet body and the frequency converter provided by the present invention, the first air duct baffle and the second air baffle are provided at the upper end and the lower end of the secondary coil of the transformer, respectively, air from the first air inlet passes through the primary coil and the secondary coil of the transformer and then flows out of the transformer cabinet via the first air outlet, and air from the second air inlet passes through the power units and the secondary coil of the transformer in turn and then flows out of the transformer cabinet via the first air outlet. Thus, it can be seen that the cooling air duct of the power units and the cooling air duct of the secondary coil of the transformer are connected in series, and the air ducts connected in series and the cooling air duct of the primary coil of the transformer are connected in parallel. The design of air ducts connected in series and in parallel can improve the utilization of cooling air and guarantee a low static pressure in the frequency converter cabinet body. Thus, the utilization of the fan is improved, the heat dissipation requirement for the frequency converter can be satisfied by using a lower-performance fan, and then the fan performance required for the frequency converter is reduced.

2. In the frequency converter cabinet body and the frequency converter provided by the present invention, the asymmetric design is adopted for the second air outlets on the first air duct baffle, and the clearance between the side, close to the power unit cabinet, of the second air outlets and the second coil is less than the clearance between the side away from the power unit cabinet and the secondary coil so that the static pressure on the side where the secondary coil is close to the power unit cabinet is greater than the static pressure on the other side where the secondary coil is away from the power unit cabinet. Then, more of the cooling air entering the transformer cabinet from the power unit cabinet can pass by the secondary coil of the transformer, ensuring that the secondary coil of the transformer can fully be cooled.

3. In the frequency converter cabinet body and the frequency converter provided by the present invention, with the third air outlet provided on the first air duct baffle, the third air outlet can be opened or closed according to the pressure loss after air passes through the secondary coil and the power unit to ensure that the static pressures in the frequency converter cabinet and the power unit cabinet are both small and each power unit can fully be cooled.

4. In the frequency converter cabinet body and the frequency converter provided by the present invention, the third air outlet corresponds to a plurality of open states, and different open states correspond to different ventilating apertures. According to the pressure loss after cooling air passes through the power units and the secondary coil, the third air outlet can be adjusted to different open states to adjust the ventilation volume of each of the second air outlets and the third air outlet in such a way that a relatively balanced static pressure is achieved in the space between the first air duct baffle and the second air duct baffle and in the power unit cabinet. With the cooling effect on the power units guaranteed, air as much as possible passes through the secondary coil of the transformer, and the cooling effect on the secondary coil is improved. Therefore, the frequency converter cabinet body provided in the present embodiment can be applied to frequency converters having different number of power units and different layout patterns and has high applicability.

5. In the frequency converter cabinet body and the frequency converter provided by the present invention, a plurality of third air inlets allowing coil windings to pass through are provided on the second air duct baffle, a clearance exists between the third air inlets and the outer side wall of the secondary coil after coil windings pass through the third air inlets, air from the first air inlet can pass through the third air inlets and then contact the secondary coil of the transformer to help air from the second air inlet to cool the secondary coil, and thus the cooling requirement for the secondary coil is guaranteed to be satisfied.

The above-mentioned embodiments are only preferred embodiments of the present invention, but are not used to restrict the present invention. Without departing the spirit and principle of the present invention, modifications, equivalent replacements, and improvements should all fall within the scope of protection of the present invention.

The invention claimed is:

1. A frequency converter cabinet body, comprising:
a transformer cabinet; configured to accommodate a transformer having a primary coil and a secondary coil, a top of the transformer cabinet forming a first air outlet configured to flow air out of the transformer cabinet, a side wall of the transformer cabinet forming a first air inlet, the transformer cabinet including a first air duct baffle at an upper end of the secondary coil and a second air duct baffle at a lower end of the secondary coil, and the first air outlet being configured to pass air blown by a fan through the primary coil and the secondary coil from the first air inlet; and
a power unit cabinet configured to accommodate at least one power unit, a front side wall of the power unit cabinet forming a second air inlet, a rear side of the power unit cabinet communicating with the transformer cabinet, the first air duct baffle and the second air duct baffle being configured to permit air entering the transformer cabinet from the power unit cabinet to be directly blown onto the secondary coil, and the first air outlet being configured to pass air through the at least one power unit and the secondary coil from the second air inlet, wherein
the first air duct baffle forms second air outlets in a direction parallel to a rear side wall of the power unit cabinet, a number of the second air outlets being equal to a number of phases of the transformer, a respective coil winding of the transformer being configured to pass through a corresponding one of the second air outlets, and the respective coil winding including a coil winding of the secondary coil and the primary coil, and
each of the second air outlets has a first side and a second side, the first side being closer to the power unit cabinet than the second side, a first clearance being less than a second clearance with respect to each of the second air outlets, the first clearance being between the first side and the respective coil winding, and the second clearance being between the second side and the respective coil winding.

2. The frequency converter cabinet body of claim 1, wherein
a front side of the transformer cabinet is configured to communicate with the rear side of the power unit cabinet; and
the first air inlet is at a bottom of a rear side wall of the transformer cabinet.

3. The frequency converter cabinet body of claim 1, wherein
the first air duct baffle forms a third air outlet between the second air outlets and the power unit cabinet;
the first air duct baffle being is configured to pass air from the second air inlet out via the first air outlet through each of the second air outlets based on the third air outlet being in a closed state; and
the first air duct baffle being is configured to pass air from the second air inlet out via the first air outlet through each of the second air outlets and the third air outlet based on the third air outlet being in an open state.

4. The frequency converter cabinet body of claim 3, wherein the third air outlet is configured to be in one of at least two open states, the at least two open states including the open state, and the at least two open states corresponding to different ventilating apertures.

5. The frequency converter cabinet body of claim 3, wherein
the second air duct baffle forms third air outlets in the direction parallel to the rear side wall of the power unit cabinet, the third air outlets including the third air outlet, and a number of the third air outlets being equal to the number of phases of the transformer;
each respective coil winding passes through a corresponding one of the third air outlets; and
a clearance is between each of the respective coil winding and the corresponding one of the third air outlets.

6. The frequency converter cabinet body of claim 1, wherein a first distance between the front side wall of the power unit cabinet and the rear side wall of the power unit cabinet is greater than a length of a power unit among the at least one power units, the first distance being less than twice the length of the power unit.

7. A frequency converter, comprising:
a transformer;
at least one power unit;
at least one fan; and
the frequency converter cabinet body of claim 1, wherein
the at least one fan is at the first air outlet, the at least one fan being configured to draw air from the transformer,
the transformer is in the transformer cabinet, and
the at least one power unit is provided in the power unit cabinet.

8. The frequency converter of claim 7, wherein the at least one power unit includes a plurality of power units in a matrix, only one layer of the plurality of power units being aligned in a direction perpendicular to the front side wall of the power unit cabinet.

9. The frequency converter cabinet body of claim 2, wherein
the first air duct baffle forms a third air outlet between the second air outlets and the power unit cabinet;
the first air duct baffle is configured to pass air from the second air inlet out via the first air outlet through each of the second air outlets based on the third air outlet being in a closed state; and
the first air duct baffle is configured to pass air from the second air inlet out via the first air outlet through each of the second air outlets and the third air outlet based on the third air outlet being in an open state.

10. The frequency converter cabinet body of claim 9, wherein the third air outlet is configured to be in one of at least two open states, the at least two open states including the open state, and the at least two open states corresponding to different ventilating apertures.

11. The frequency converter cabinet body of claim 9, wherein
the second air duct baffle forms third air outlets in the direction parallel to the rear side wall of the power unit cabinet, the third air outlets including the third air outlet, and a number of the third air outlets being equal to the number of phases of the transformer;

each respective coil winding passes through a corresponding one of the third air outlets; and a clearance is between each of the respective coil winding and the corresponding one of the third air outlets.

12. The frequency converter cabinet body of claim 2, wherein a first distance between the front side wall of the power unit cabinet and the rear side wall of the power unit cabinet is greater than a length of a power unit among the at least one power units, the first distance being less than twice the length of the power unit.

13. The frequency converter cabinet body of claim 3, wherein a first distance between the front side wall of the power unit cabinet and the rear side wall of the power unit cabinet is greater than a length of a power unit among the at least one power unit, the first distance being less than twice the length of the power unite.

14. A frequency converter, comprising:
a transformer;
at least one power unit;
at least one fan; and
the frequency converter cabinet body of claim 2, wherein
the at least one fan is at the first air outlet, the at least one fan being configured to draw air from the transformer,
the transformer is in the transformer cabinet, and
the at least one power unit is in the power unit cabinet.

15. The frequency converter of claim 1, wherein the at least one power unit includes a plurality of power units in a matrix, only one layer of the plurality of power units being aligned in a direction perpendicular to the front side wall of the power unit cabinet.

16. A frequency converter, comprising:
a transformer;
at least one power unit;
at least one fan; and
the frequency converter cabinet body of claim 3, wherein
the at least one fan is at the first air outlet, the at least one fan being configured to draw air from the transformer,
the transformer is in the transformer cabinet, and
the at least one power unit is in the power unit cabinet.

17. The frequency converter of claim 16, wherein the at least one power unit includes a plurality of power units in a matrix, only one layer of the plurality of power units being aligned in a direction perpendicular to the front side wall of the power unit cabinet.

18. The frequency converter cabinet body of claim 7, wherein
the first air duct baffle forms a third air outlet between the second air outlets and the power unit cabinet;
the first air duct baffle is configured to pass air from the second air inlet out via the first air outlet through each of the second air outlets based on the third air outlet being in a closed state; and
the first air duct baffle is configured to pass air from the second air inlet out via the first air outlet through each of the second air outlets and the third air outlet based on the third air outlet being in an open state.

19. The frequency converter cabinet body of claim 18, wherein the third air outlet is configured to be in one of at least two open states, the at least two open states including the open state, and the at least two open states corresponding to different ventilating apertures.

20. The frequency converter cabinet body of claim 18, wherein
the second air duct baffle forms third air outlets in the direction parallel to the rear side wall of the power unit cabinet, the third air outlets including the third air outlet, and a number of the third air outlets being equal to the number of phases of the transformer;
each respective coil winding passes through a corresponding one of the third air outlets; and
a clearance is between each of the respective coil winding and the corresponding one of the third air outlets.

\* \* \* \* \*